(12) United States Patent
Kim et al.

(10) Patent No.: US 9,875,940 B2
(45) Date of Patent: Jan. 23, 2018

(54) METHODS FOR FORMING TRANSISTOR DEVICES WITH DIFFERENT THRESHOLD VOLTAGES AND THE RESULTING DEVICES

(71) Applicant: GLOBALFOUNDRIES Inc., Grand Cayman (KY)

(72) Inventors: Hoon Kim, Clifton Park, NY (US);
Ruilong Xie, Niskayuna, NY (US);
Min Gyu Sung, Latham, NY (US);
Chanro Park, Clifton Park, NY (US)

(73) Assignee: GLOBALFOUNDRIES Inc., Grand Cayman (KY)

( * ) Notice: Subject to any disclaimer, the term of this patent is extended or adjusted under 35 U.S.C. 154(b) by 256 days.

(21) Appl. No.: 14/820,701

(22) Filed: Aug. 7, 2015

(65) Prior Publication Data

US 2017/0040220 A1    Feb. 9, 2017

(51) Int. Cl.
| | |
|---|---|
| *H01L 21/8234* | (2006.01) |
| *H01L 21/02* | (2006.01) |
| *H01L 29/51* | (2006.01) |
| *H01L 21/28* | (2006.01) |
| *H01L 29/49* | (2006.01) |
| *H01L 27/088* | (2006.01) |

(52) U.S. Cl.
CPC .. *H01L 21/82345* (2013.01); *H01L 21/02181* (2013.01); *H01L 21/28088* (2013.01); *H01L 27/088* (2013.01); *H01L 29/4966* (2013.01); *H01L 29/517* (2013.01)

(58) Field of Classification Search
CPC ......... H01L 21/82345; H01L 21/02181; H01L 29/517; H01L 21/28088; H01L 29/4966; H01L 27/088
USPC ....................................................... 257/392
See application file for complete search history.

(56) References Cited

U.S. PATENT DOCUMENTS

2016/0020104 A1    1/2016   Lin et al.

OTHER PUBLICATIONS

Notice of Allowance from related U.S. Appl. No. 14/820,661 dated Jul. 22, 2016.

*Primary Examiner* — Hrayr A Sayadian
(74) *Attorney, Agent, or Firm* — Amerson Law Firm, PLLC

(57) ABSTRACT

A method includes forming first and second gate cavities so as to expose first and second portions of a semiconductor material. A gate insulation layer is formed in the first and second gate cavities. A first work function material layer is formed in the first gate cavity. A second work function material layer is formed in the second gate cavity. A first barrier layer is selectively formed above the first work function material layer and the gate insulation layer in the first gate cavity. A second barrier layer is formed above the first barrier layer in the first gate cavity and above the second work function material layer and the gate insulation layer in the second gate cavity. A conductive material is formed above the second barrier layer in the first and second gate cavities in the presence of a treatment species to define first and second gate electrode structures.

15 Claims, 16 Drawing Sheets

METHODS FOR FORMING TRANSISTOR DEVICES WITH DIFFERENT THRESHOLD VOLTAGES AND THE RESULTING DEVICES

BACKGROUND OF THE INVENTION

1. Field of the Invention

The present disclosure generally relates to the fabrication of semiconductor devices, and, more particularly, to methods for forming transistor devices with different threshold voltages and the resulting devices.

2. Description of the Related Art

In modern integrated circuits, such as microprocessors, storage devices and the like, a very large number of circuit elements, especially transistors, are provided on a restricted chip area. Transistors come in a variety of shapes and forms, e.g., planar transistors, FinFET transistors, nanowire devices, etc. The transistors are typically either NMOS (NFET) or PMOS (PFET) type devices wherein the "N" and "P" designation is based upon the type of dopants used to create the source/drain regions of the devices. So-called CMOS (Complementary Metal Oxide Semiconductor) technology or products refers to integrated circuit products that are manufactured using both NMOS and PMOS transistor devices. Irrespective of the physical configuration of the transistor device, each device comprises drain and source regions and a gate electrode structure positioned above and between the source/drain regions. Upon application of an appropriate control voltage to the gate electrode, a conductive channel region forms between the drain region and the source region.

In some applications, fins for FinFET devices are formed such that the fin is vertically spaced apart from and above the substrate with an isolation material positioned between the fin and the substrate. FIG. 1 is a perspective view of an illustrative prior art FinFET semiconductor device 100 that is formed above a semiconductor substrate 105 at an intermediate point during fabrication. In this example, the FinFET device 100 includes three illustrative fins 110, an isolation material 130, a gate structure 115, sidewall spacers 120 and a gate cap layer 125. The fins 110 have a three-dimensional configuration: a height, a width, and an axial length. The portions of the fins 110 covered by the gate structure 115 are the channel regions of the FinFET device 100, while the portions of the fins 110 positioned laterally outside of the spacers 120 are part of the source/drain regions of the device 100. Although not depicted, the portions of the fins 110 in the source/drain regions may have additional epi semiconductor material formed thereon in either a merged or unmerged condition.

In an integrated circuit device, there are different performance requirements for different functional blocks or regions of the device. It is useful to provide transistors with different threshold voltages to adapt to the different performance requirements. Generally, threshold voltages may be provided by providing different work function materials in the gate electrode, doping the gate dielectric material, etc. However, providing different work function materials in the different regions significantly complicates the process flow. The effectiveness of doping processes can also be affected by the channel length of the transistor devices and the thermal budget. High temperature anneal processes performed to activate implanted dopant material and repair damage to the crystalline structure of the substrate can cause difficulties with diffusion of dopant or stress-inducing ions, stress relaxation and defect generation.

The present disclosure is directed to various methods and resulting devices that may avoid, or at least reduce, the effects of one or more of the problems identified above.

SUMMARY OF THE INVENTION

The following presents a simplified summary of the invention in order to provide a basic understanding of some aspects of the invention. This summary is not an exhaustive overview of the invention. It is not intended to identify key or critical elements of the invention or to delineate the scope of the invention. Its sole purpose is to present some concepts in a simplified form as a prelude to the more detailed description that is discussed later.

Generally, the present disclosure is directed to various methods of forming semiconductor devices. A method includes forming first and second gate cavities so as to expose first and second portions, respectively, of a semiconductor material. A gate insulation layer is formed in the first and second gate cavities. A first work function material layer is formed in the first gate cavity and a second work function material layer is formed in the second gate cavity. A first barrier layer is selectively formed above the first work function material layer and the gate insulation layer in the first gate cavity. A second barrier layer is formed above the first barrier layer in the first gate cavity and above the second work function material layer and the gate insulation layer in the second gate cavity. A conductive material is formed above the second barrier layer in the first and second gate cavities in the presence of a treatment species to define first and second gate electrode structures, respectively.

Another illustrative method disclosed herein includes, among other things, forming a first gate electrode structure in a first cavity. The first gate electrode structure includes a first gate insulation layer, a first barrier layer formed above a first portion of the first gate insulation layer, a first work function material layer formed above the first barrier layer, and a second barrier layer formed above the first work function material layer and a second portion of the first gate insulation layer. A second gate electrode structure is formed in a second cavity. The second gate electrode structure includes a second gate insulation layer, a second work function material layer formed above a first portion of the second gate insulation layer, and the second barrier layer formed above the second work function material layer and a second portion of the second gate insulation layer. A conductive material is formed above the second barrier layer in the first and second cavities in the presence of a treatment species to define first and second gate electrode structures, respectively.

One illustrative device disclosed herein includes, among other things, a first transistor device having a first threshold voltage and including a first gate electrode structure positioned in a first gate cavity. The first gate electrode structure includes a first gate insulation layer, a first barrier layer formed above a first portion of the first gate insulation layer, a first work function material layer formed above the first barrier layer, a second barrier layer formed above the first work function material layer and a second portion of the first gate insulation layer, and a first conductive material formed above the second barrier layer. A second transistor device has a second threshold voltage different than the first threshold voltage and includes a second gate electrode structure positioned in a second cavity defined in the dielectric layer. The second gate electrode structure includes a second gate insulation layer, a second work function material layer formed above a first portion of the second gate insulation layer, the second barrier layer formed above the second work function material layer and a second portion of the second gate insulation layer, and a second conductive material formed above the second barrier layer.

BRIEF DESCRIPTION OF THE DRAWINGS

The disclosure may be understood by reference to the following description taken in conjunction with the accompanying drawings, in which like reference numerals identify like elements, and in which.

Figure 1:
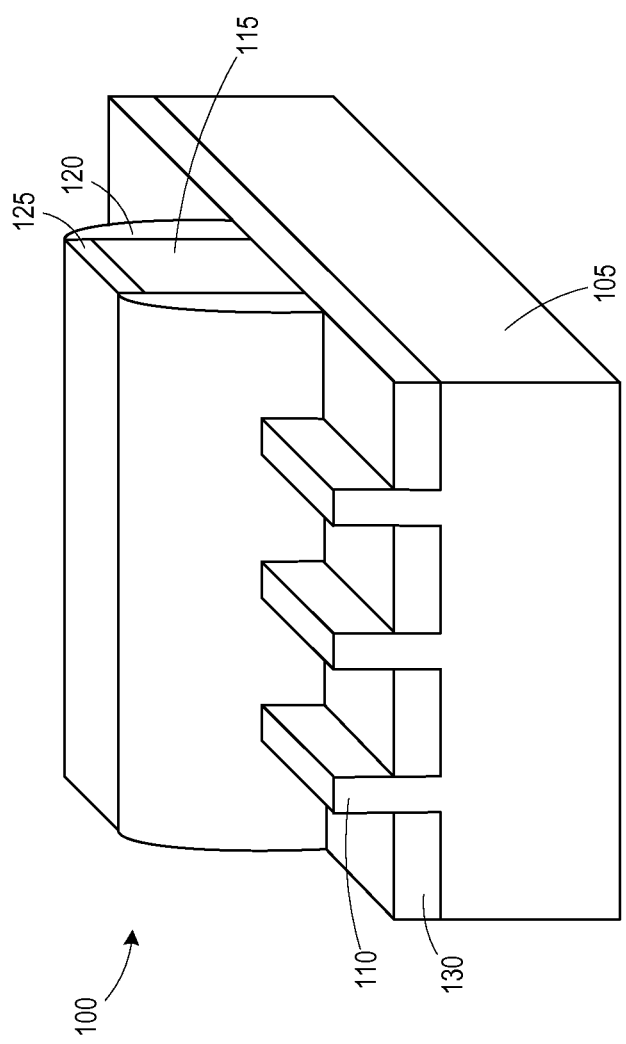
FIG. 1 schematically depicts an illustrative prior art finFET device.

While the subject matter disclosed herein is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION

Various illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The present subject matter will now be described with reference to the attached figures. Various structures, systems and devices are schematically depicted in the drawings for purposes of explanation only and so as to not obscure the present disclosure with details that are well known to those skilled in the art. Nevertheless, the attached drawings are included to describe and explain illustrative examples of the present disclosure. The words and phrases used herein should be understood and interpreted to have a meaning consistent with the understanding of those words and phrases by those skilled in the relevant art. No special definition of a term or phrase, i.e., a definition that is different from the ordinary and customary meaning as understood by those skilled in the art, is intended to be implied by consistent usage of the term or phrase herein. To the extent that a term or phrase is intended to have a special meaning, i.e., a meaning other than that understood by skilled artisans, such a special definition will be expressly set forth in the specification in a definitional manner that directly and unequivocally provides the special definition for the term or phrase.

The present disclosure generally relates to various methods of forming transistor devices with different threshold voltages and the resulting devices. As will be readily apparent to those skilled in the art upon a complete reading of the present application, the present method is applicable to a variety of devices, including, but not limited to, logic devices, memory devices, etc. With reference to the attached figures, various illustrative embodiments of the methods and devices disclosed herein will now be described in more detail.

FIGS. 2A-2J illustrate various illustrative methods disclosed herein for forming an integrated circuit product 200 having transistor devices with varying threshold voltages. In the illustrated embodiment, the product includes finFET transistor devices, but the techniques described herein are not so limited, and they may be applied to other types of devices, such as planar devices. FIGS. 2A-2J show a cross-sectional view of the product 200 taken through the long axis of one of a first fin 205A formed in a substrate 210 in a first device region 215A and a second fin 205B formed in the substrate 210 in a second device region 215B. The cross-sectional view is taken in a direction corresponding to the gate length direction of the product 200. In some cases, the fins 205A, 205B may be portions of the same originally formed fin that extends across both of the device regions 215A, 215B. In other cases, the fins 205A, 205B may each be a part of a different originally formed fin.

In one illustrative embodiment, a replacement gate technique is used to form devices in the product 200. Placeholder gate structures 220A, 220B are formed above the fins 205A, 205B, respectively, prior to the formation of a replacement gate structure. The placeholder gate structures 220A, 220B each includes a sacrificial placeholder material 225A, 225B, such as polysilicon, and a gate insulation layer (not separately shown), such as silicon dioxide. Also depicted are illustrative gate cap layers 230A, 230B and sidewall spacers 235A, 235B, both of which may be made of a material such as silicon nitride. The size and materials of construction for the gate structures may be the same or different in the different device regions 215A, 215B.

The transistor devices formed in the product 200 depicted herein may be either NMOS or PMOS transistors, or a combination of both. Additionally, various doped regions, e.g., halo implant regions, well regions and the like, may be formed, but are not depicted in the attached drawings. The substrate 210 may have a variety of configurations, such as the depicted bulk silicon configuration. The substrate 210 may also have a silicon-on-insulator (SOI) configuration that includes a bulk silicon layer, a buried insulation layer and an active layer, wherein semiconductor devices are formed in and above the active layer. The substrate 210 may be formed of silicon or silicon germanium or it may be made of materials other than silicon, such as germanium. Thus, the terms "substrate" or "semiconductor substrate" should be understood to cover all semiconducting materials and all forms of such materials. The substrate 210 may have different layers. For example, the fins 205A, 205B may be formed in a process layer formed above the base layer of the substrate 210.

Figure 2A:
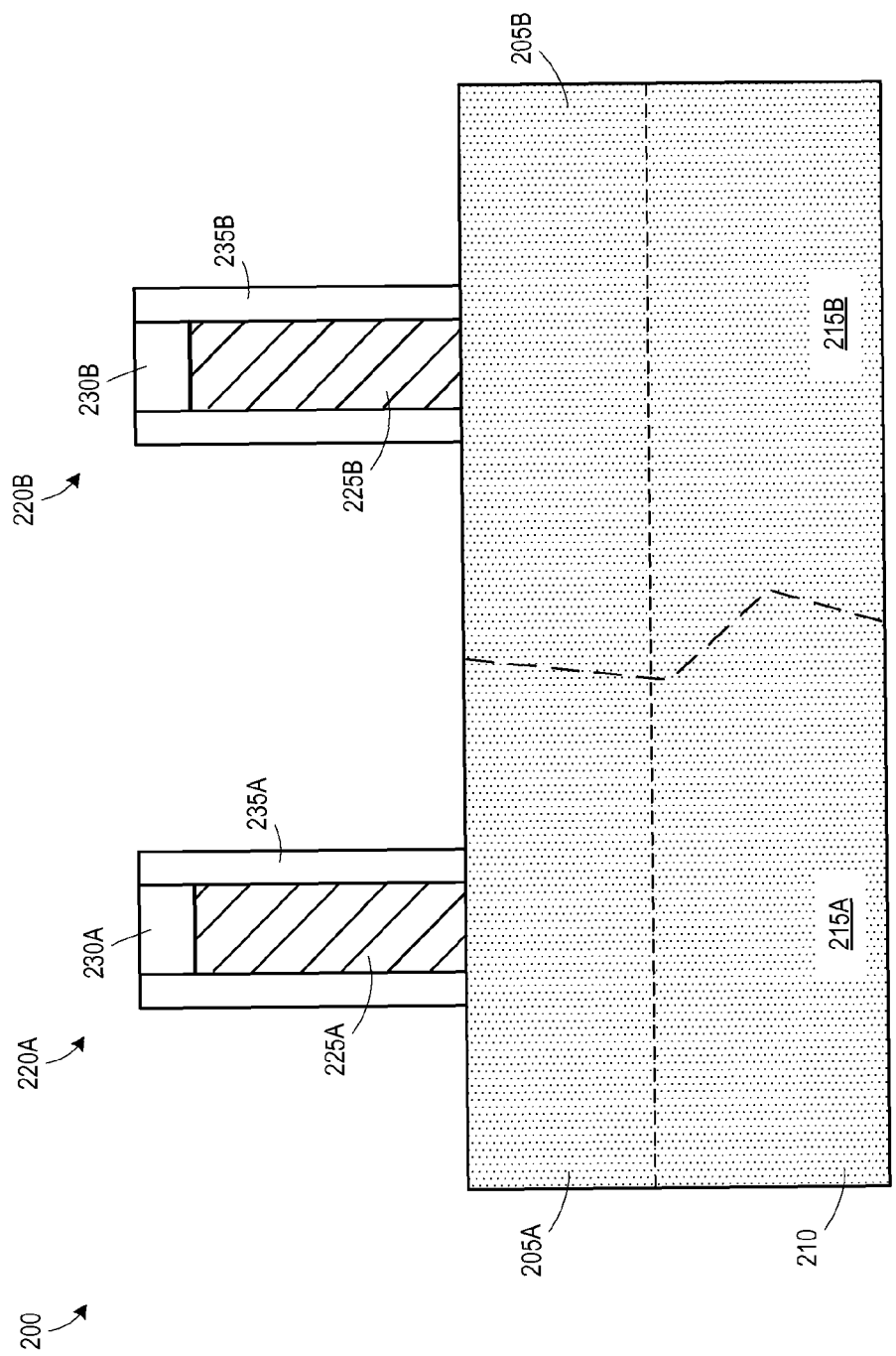
FIGS. 2A-2J and 3A-3E depict various methods disclosed herein of forming transistor devices with different threshold voltages.
Figure 2B:
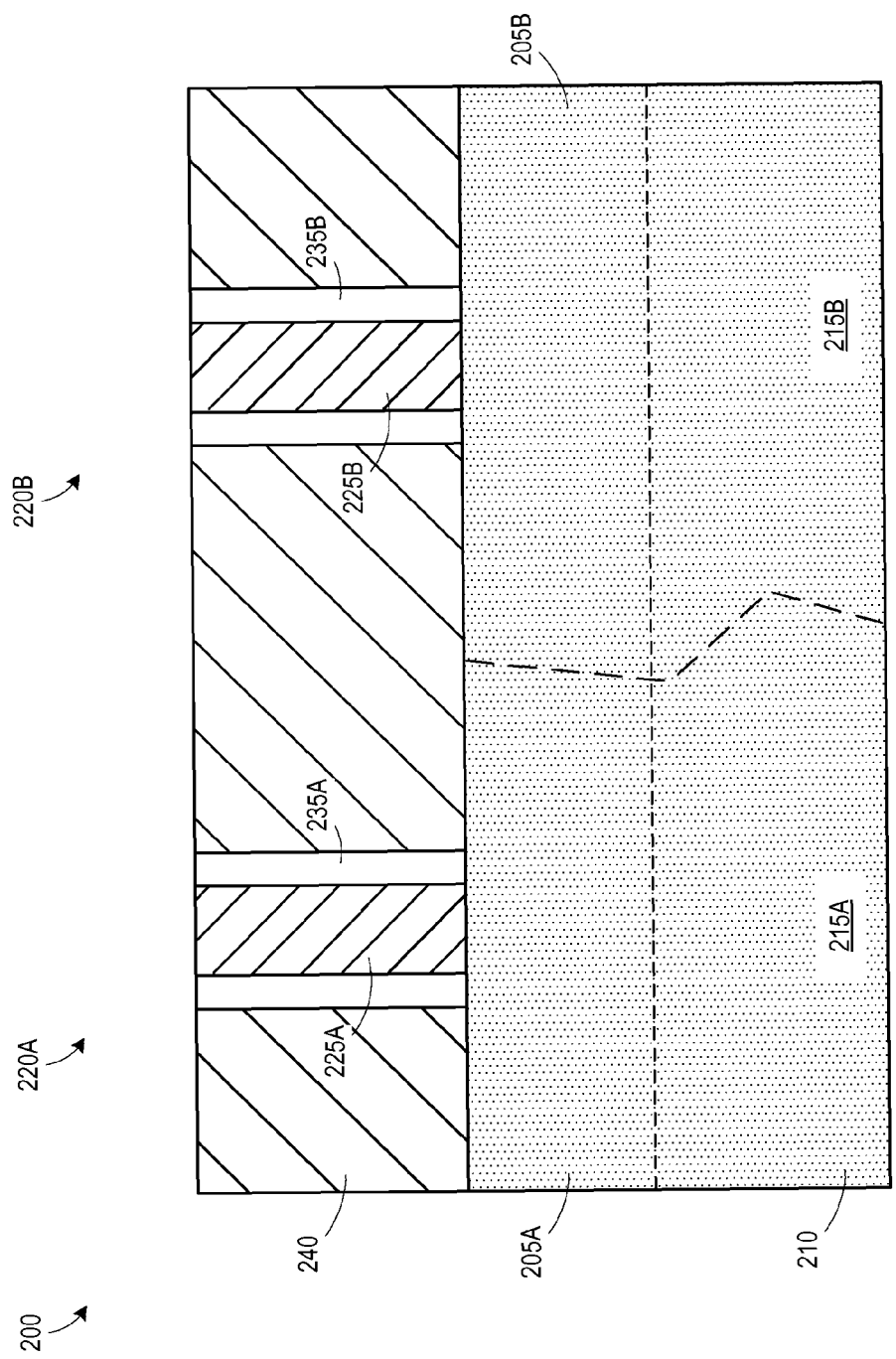

FIG. 2B illustrates the product 200 after a dielectric layer 240 was formed above the fins 205A, 205B and the placeholder gate structures 220A, 220B and planarized to remove the gate cap layers 230A, 230B and expose top surfaces of the sacrificial placeholder material 225A, 225B. In the illustrated embodiment, the dielectric layer 240 may be silicon dioxide, a low-k dielectric material having a dielectric constant of approximately 3.0 or lower or an ultra-low-k (ULK) material having a dielectric constant of approximately 2.5 or lower.

Figure 2C:
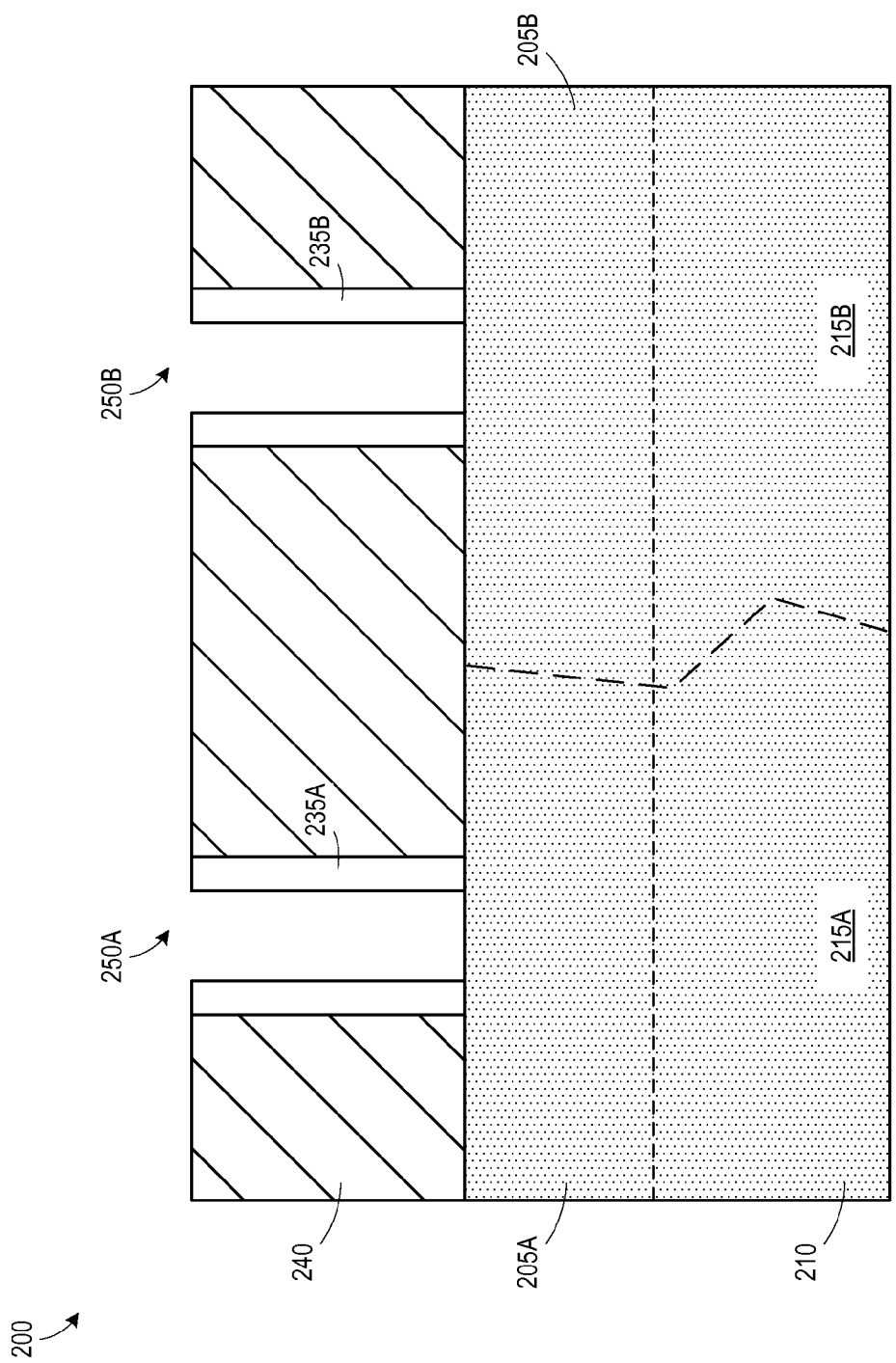

FIG. 2C illustrates the product 200 after a plurality of etch processes were performed to remove the sacrificial placeholder material 225A, 225B and any underlying gate dielectric layer, thereby defining gate cavities 250A, 250B.

Figure 2D:
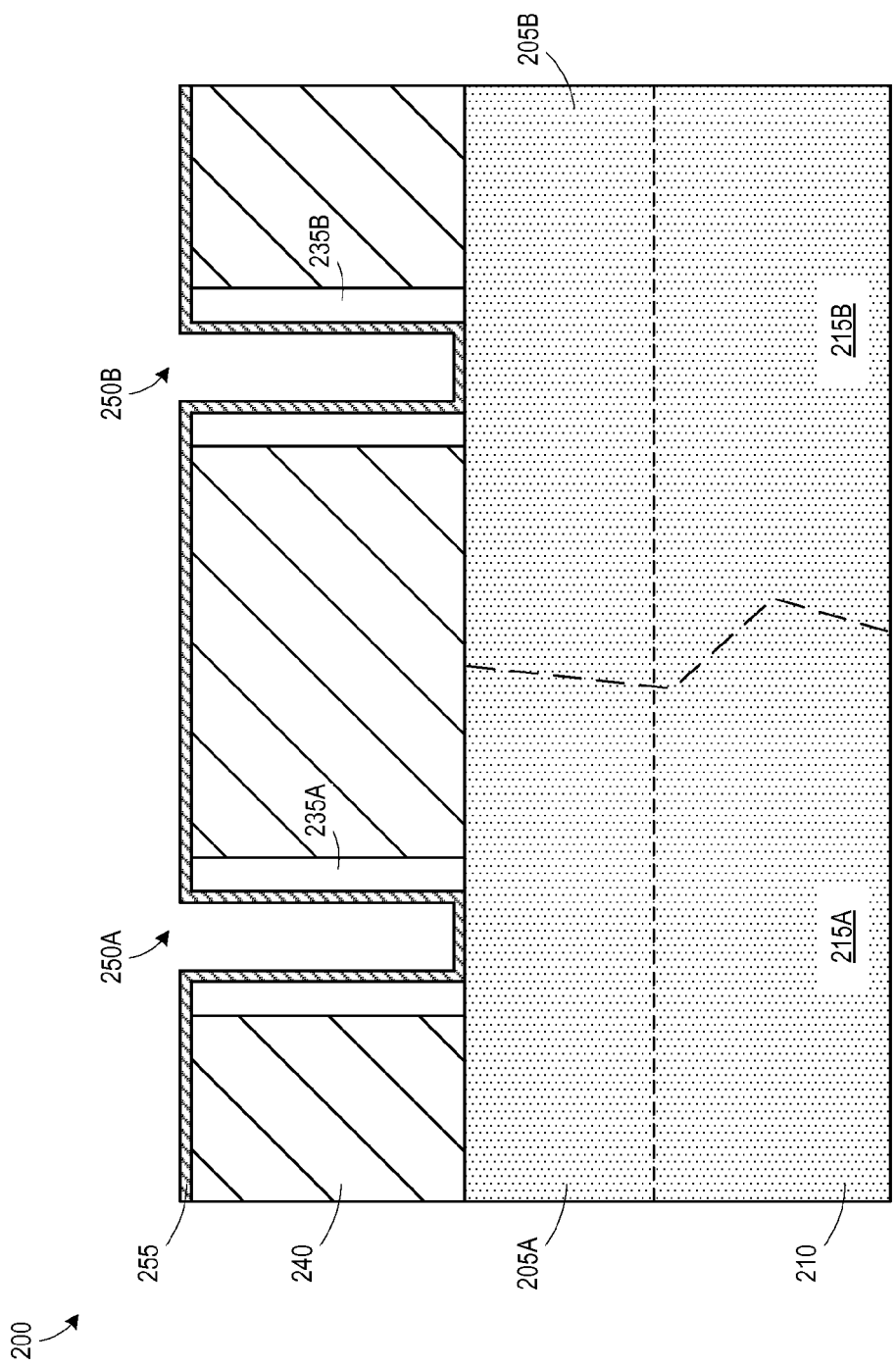

FIG. 2D illustrates the product 200 after a deposition process was performed to form a gate insulation layer 255 in the gate cavities 250A, 250B. In the illustrated embodiment, the gate insulation layer 255 is comprised of a doped high-k (k greater than 10) insulation material (where k is the relative dielectric constant), such as hafnium oxide, doped with yttrium (Y) or lanthanum (L), for example. The doping of the gate insulation layer 255 decreases the overall work function of the subsequently formed gate electrode structure, which affects the threshold voltage of the completed transistor devices, as described in greater detail below.

Figure 2E:
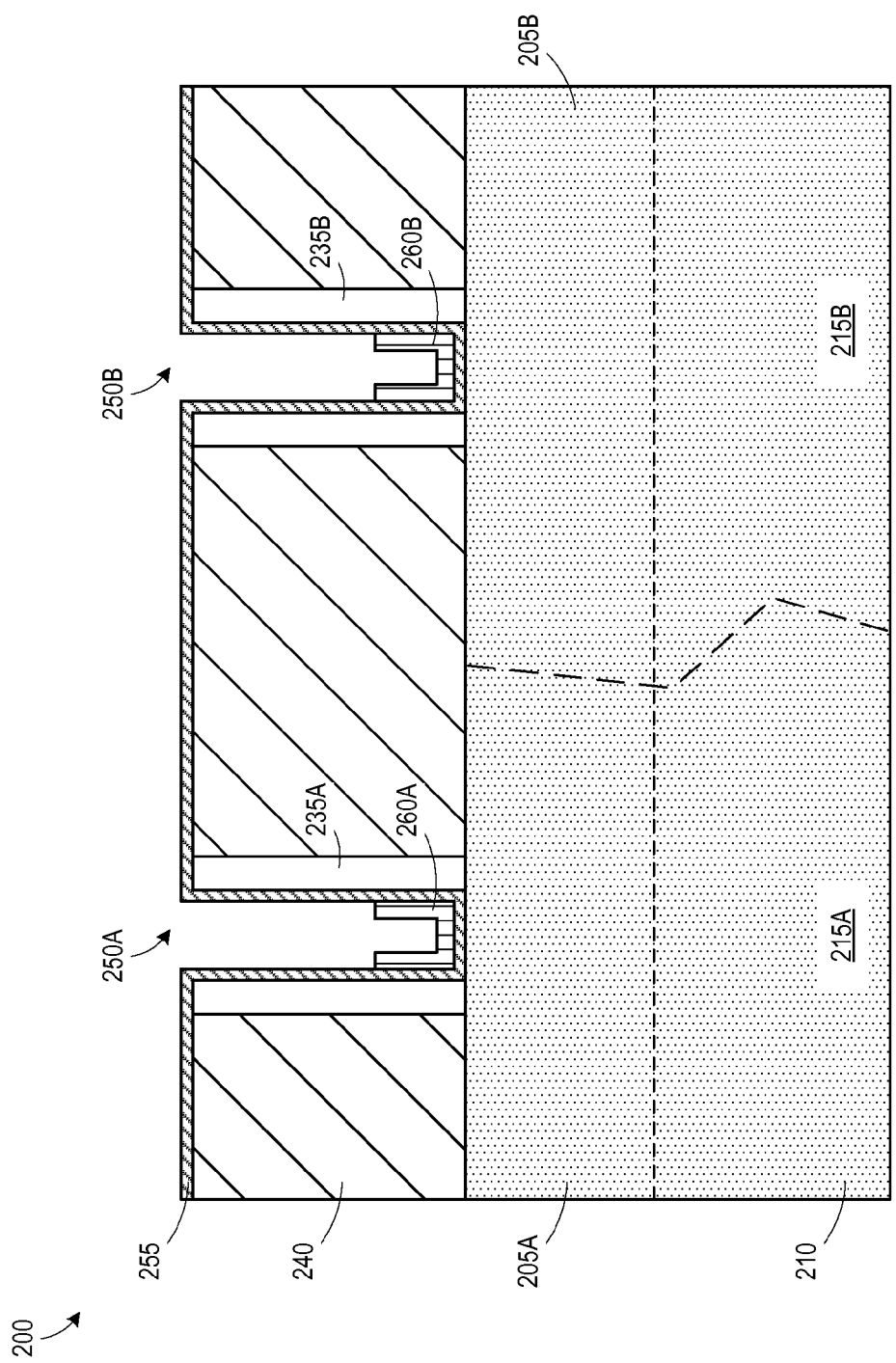

FIG. 2E illustrates the product 200 after a plurality of processes were performed to form work function material layers 260A, 260B in the gate cavities 250A, 250B, respectively. In the illustrated embodiment, the work function material layers 260A, 260B are each comprised of a stack of layers including, for example, TiN/TiC/TiN (the individual layers are not separately depicted in the drawings). In other embodiments, the stack of layers may include other material between the TiN layers, such as titanium aluminum carbide, titanium aluminum, or tantalum silicide. The work function material layer 260 was formed by depositing the stack of layers using conformal deposition processes. Then a sacrificial material, such as OPL, was formed in the gate cavities 250A, 250B and recessed to expose upper portions of the work function material layer 260. An etch process was performed to remove the exposed upper portions of the work function material layers 260A, 260B and the sacrificial material was removed, leaving the work function material layers 260A, 260B disposed in the lower portion of the gate cavities 250A, 250B, respectively, as illustrated in FIG. 2E. The particular materials selected for the work function material layers 260A, 260B also affect the threshold voltage of the completed transistor devices.

Figure 2F:
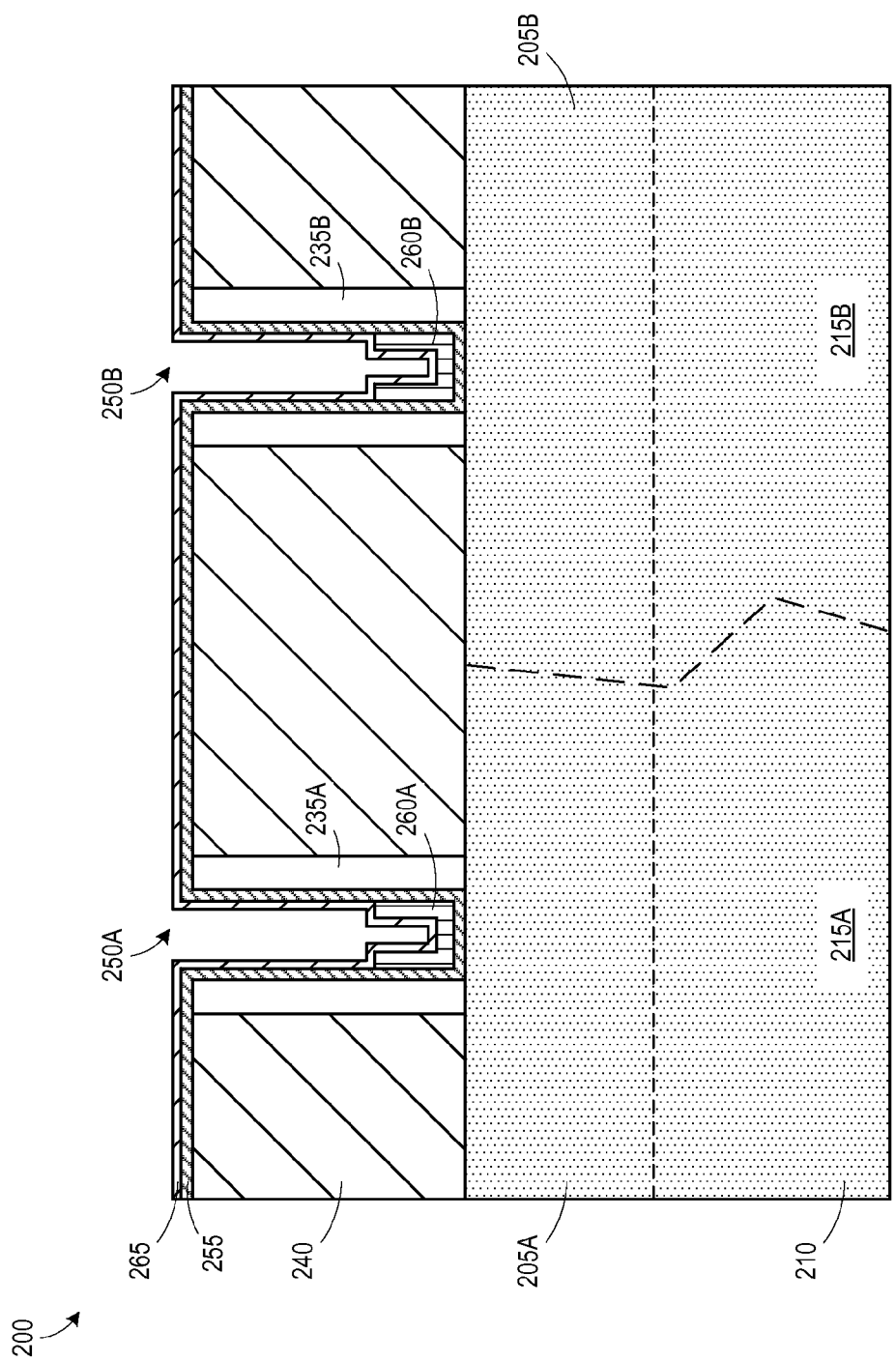

FIG. 2F illustrates the product 200 after a conformal deposition process was performed to form a barrier layer 265 (e.g., TiC or CVD cobalt) in the gate cavities 250A, 250B.

Figure 2G:
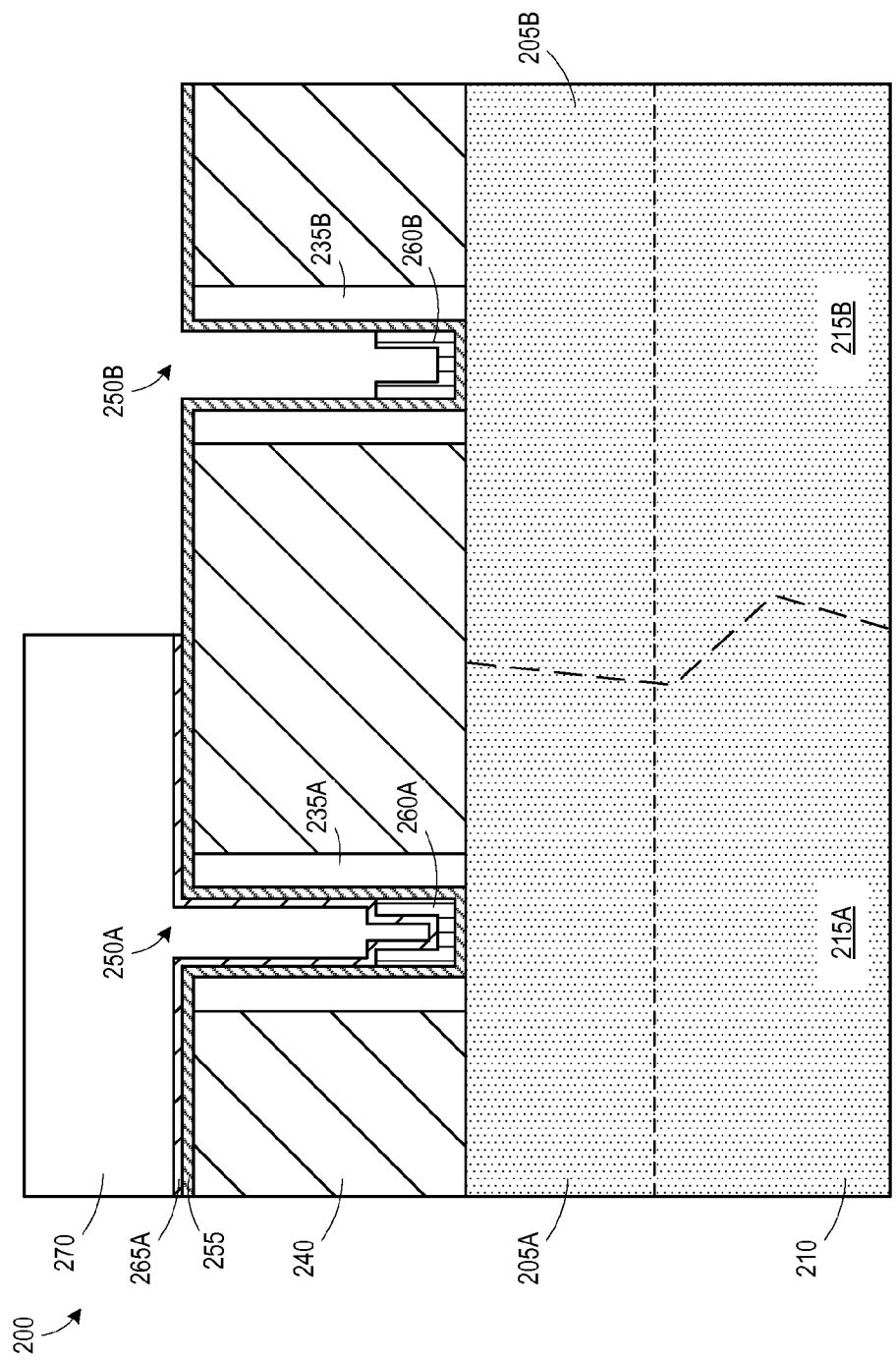

FIG. 2G illustrates the product 200 after a mask layer 270 (e.g., photoresist) was formed and patterned to expose the gate cavity 250B and an etch process was performed to remove the barrier layer 265 from the gate cavity 250B, leaving a remaining portion of the barrier layer 265A in the gate cavity 250B. The material of the barrier layer 265 is selected to provide etch selectivity with respect to the work function material layers 260A, 260B.

Figure 2H:
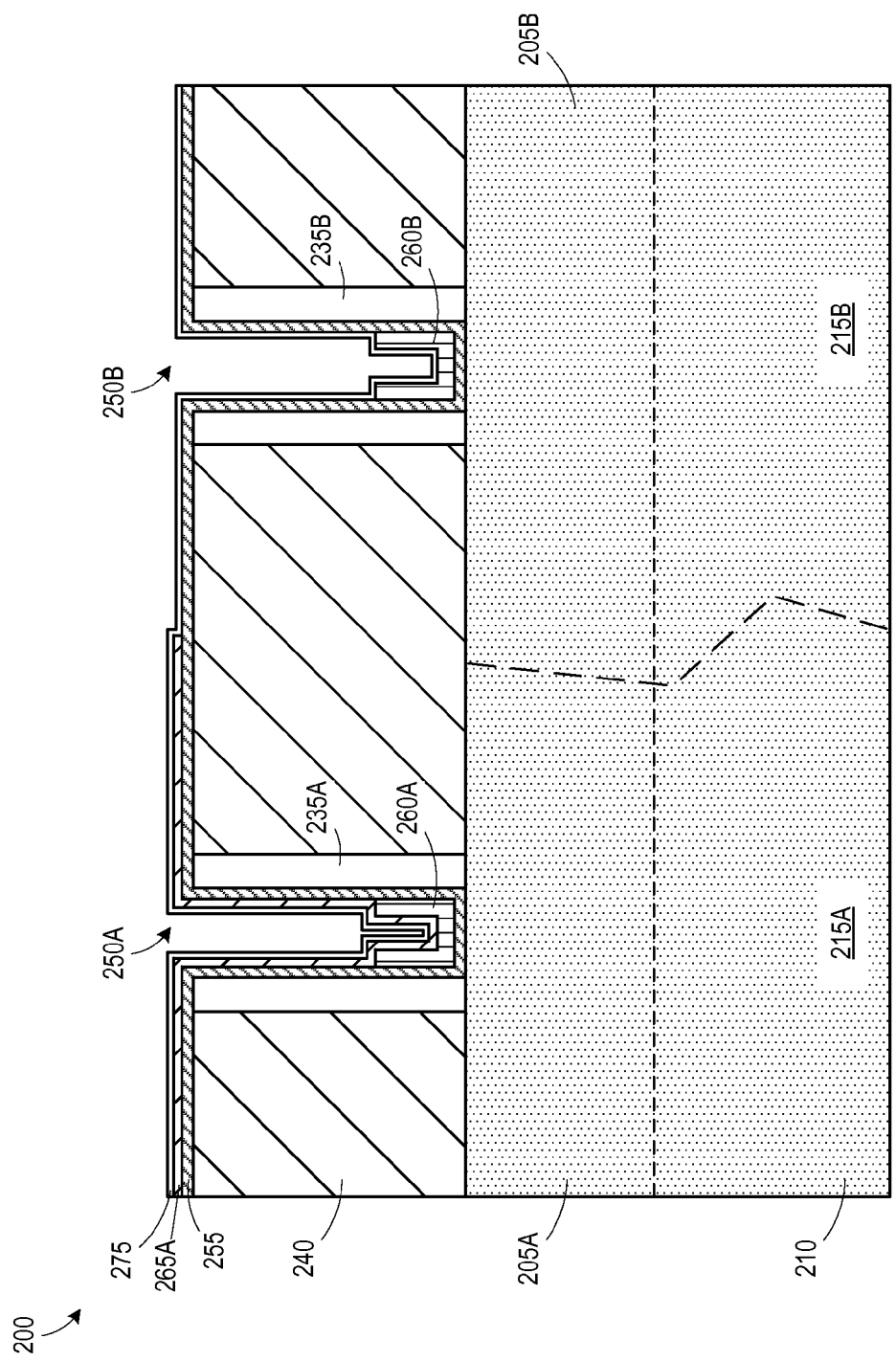

FIG. 2H illustrates the product 200 after the mask layer 270 was removed and a conformal deposition process was performed to form a second barrier layer 275 (e.g., TiN) in the gate cavities 250A, 250B.

Figure 2I:
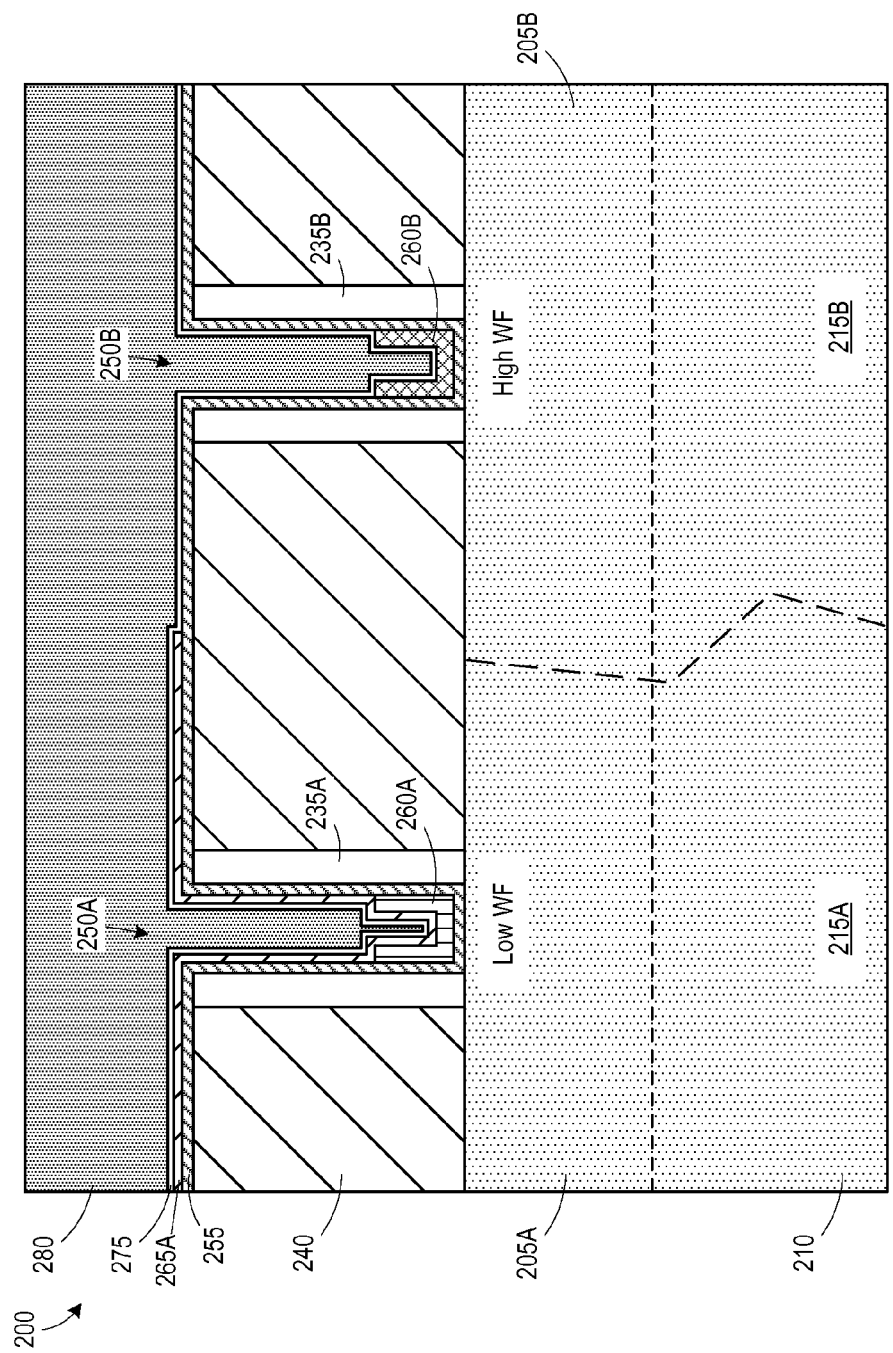

FIG. 2I illustrates the product 200 after a deposition process was performed to fill the gate cavities 250A, 250B with a conductive gate electrode material 280 (e.g., tungsten, polysilicon, aluminum, etc.). During the deposition process, a treatment species, such as fluorine, oxygen, or nitrogen, is provided in the precursor gases used in forming the conductive gate electrode material 280. For example, the precursor gas for the deposition process may be $WF_6$. The treatment species permeates the barrier layer 275 in the gate cavity 250B and increases the work function of the work function material layer 260B, but because the work function material layer 260A is covered by both barrier layers 265A, 275, the work function material layer 260A is significantly less affected by the treatment (much lower concentration of the treatment species). In general, a higher concentration of F increases the work function. In one embodiment, the concentration of F may be about 1E12 atoms/$cm^3$ in the work function material layer 260B and about 5E19 atoms/$cm^3$ in the work function material layer 260A.

Figure 2J:
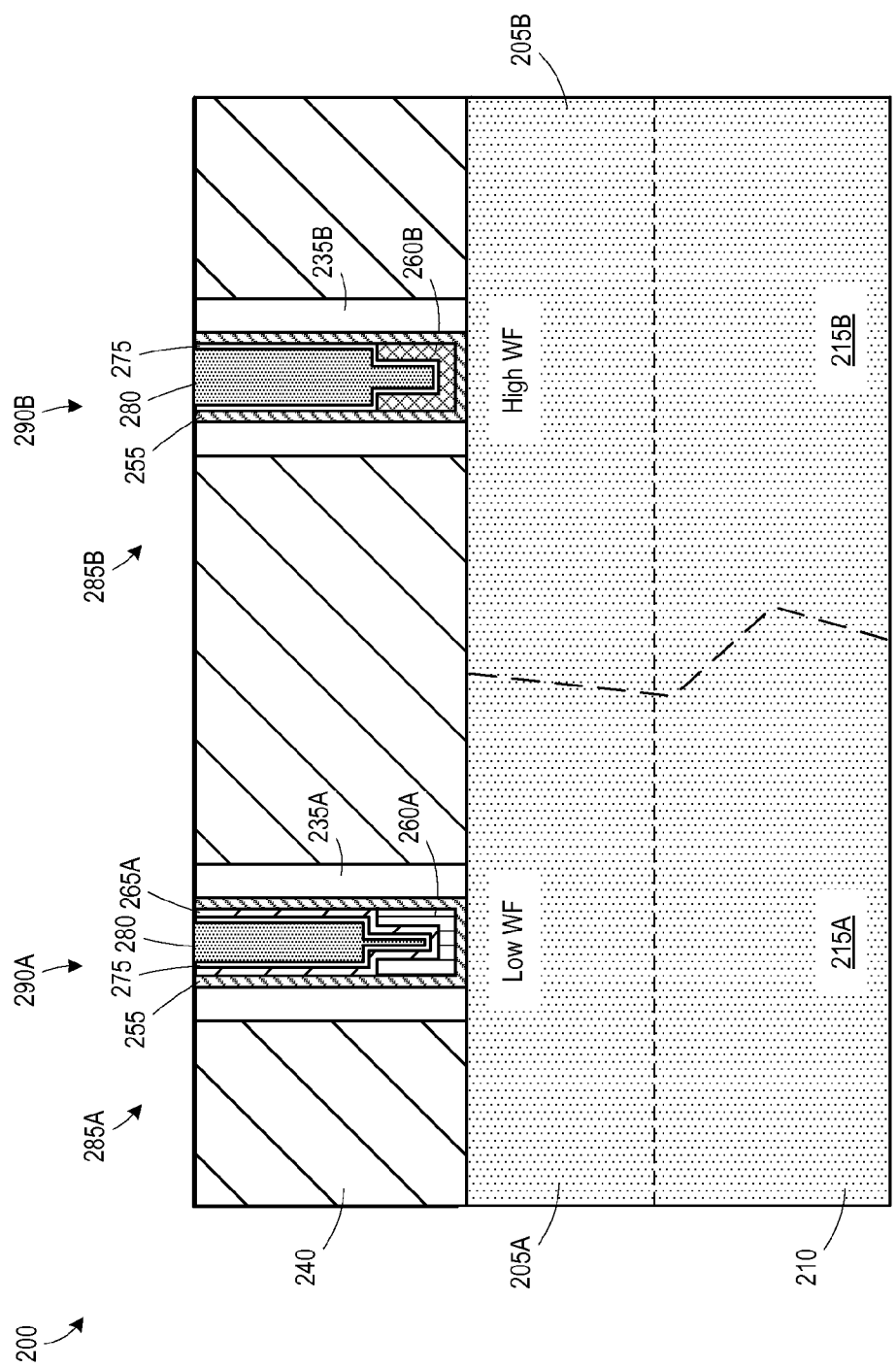

FIG. 2J illustrates the product 200 after a planarization process was performed to remove excess portions of the conductive gate electrode material 280 and excess amounts of other materials above the upper surface of the layer of insulating material 240. This process results in the definition of replacement gate electrode structures 285A, 285B. The fins 205A, 250B and the replacement gate electrode structures 285A, 285B define portions of transistor devices 290A, 290B. Other steps, not detailed herein, may be performed to complete the transistor devices 290A, 290B, such as doping the source/drain regions not covered by the gate structures, forming epitaxial material on the fins, forming silicide layers, forming contacts, etc.

The threshold voltages associated with each of the transistor devices 290A, 290B depends on the conductivity type and the treatments received. Table 1 below illustrates one example of the possible threshold voltages that may be achieved using the methods disclosed herein depending on the work function and conductivity type. The threshold voltages are classified as a regular threshold voltage (RVT) or a super low threshold voltage (SLVT). The actual threshold voltage levels associated with the RVT and SLVT designation of the devices may vary depending upon the devices under construction and on-going advances in device design and manufacturing. In one illustrative example, based upon current-day technologies, an RVT device is one having a threshold voltage that falls within the range of about 250-350 mV, such as 300 mV, while a SLVT device is one having a threshold voltage that falls within the range of about 100-200 mV, such as 150 mV. In relative terms, in one embodiment, the threshold voltage of the RVT device may be about 150 mV greater than the threshold voltage of the SLVT device. However, these illustrative numerical examples should not be considered to be a limitation of any of the inventions disclosed herein, unless such numerical limitations are expressly set forth in the attached claims.

TABLE 1

Threshold Voltage Characteristics

| $V_t$ | SLVT | RVT |
| --- | --- | --- |
| nFET | Low WF (290A) | High WF (290B) |
| pFET | High WF (290B) | Low WF (290A) |

Using the techniques described in FIGS. 2A-2J herein, transistor devices having different threshold voltages may be formed using the same processes for forming and doping the gate insulation layer 255, forming the work function material layers 260A, 260B, forming the final barrier layer 275, and forming the gate electrode material 280 in the presence of a treatment precursor. Threshold voltage changes may be modulated based on the presence or absence of the barrier layer 265A above the work function material layers 260A, 260B, respectively. Due to the large degree of integration provided, the processing is more cost effective and there is less process variation.

FIGS. 3A-3E illustrate another embodiment of various methods disclosed herein for forming an integrated circuit product 300 having transistor devices with varying threshold voltages. The reference numbers for elements of the product 300 that correspond to those in the product 200 of FIGS.

Figure 3A:
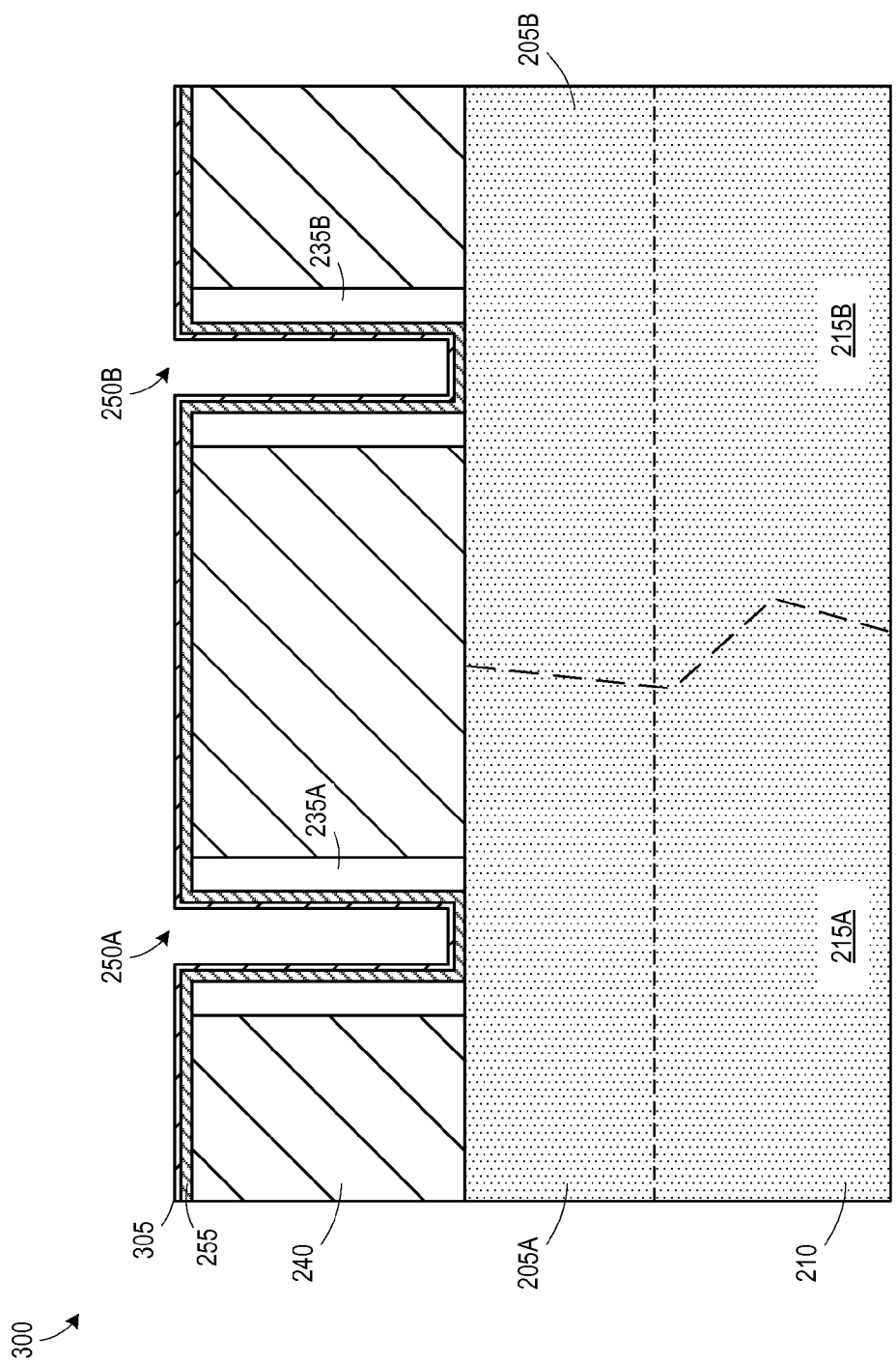

2A-2J in the process flow up to FIG. 3A are not changed, and they are not described in detail.

FIG. 3A illustrates the product 300 after the gate insulation layer 255 was formed, as shown in FIG. 2D, and a conformal deposition process was performed to form a barrier layer 305 (e.g., TiN) in the gate cavities 250A, 250B.

Figure 3B:
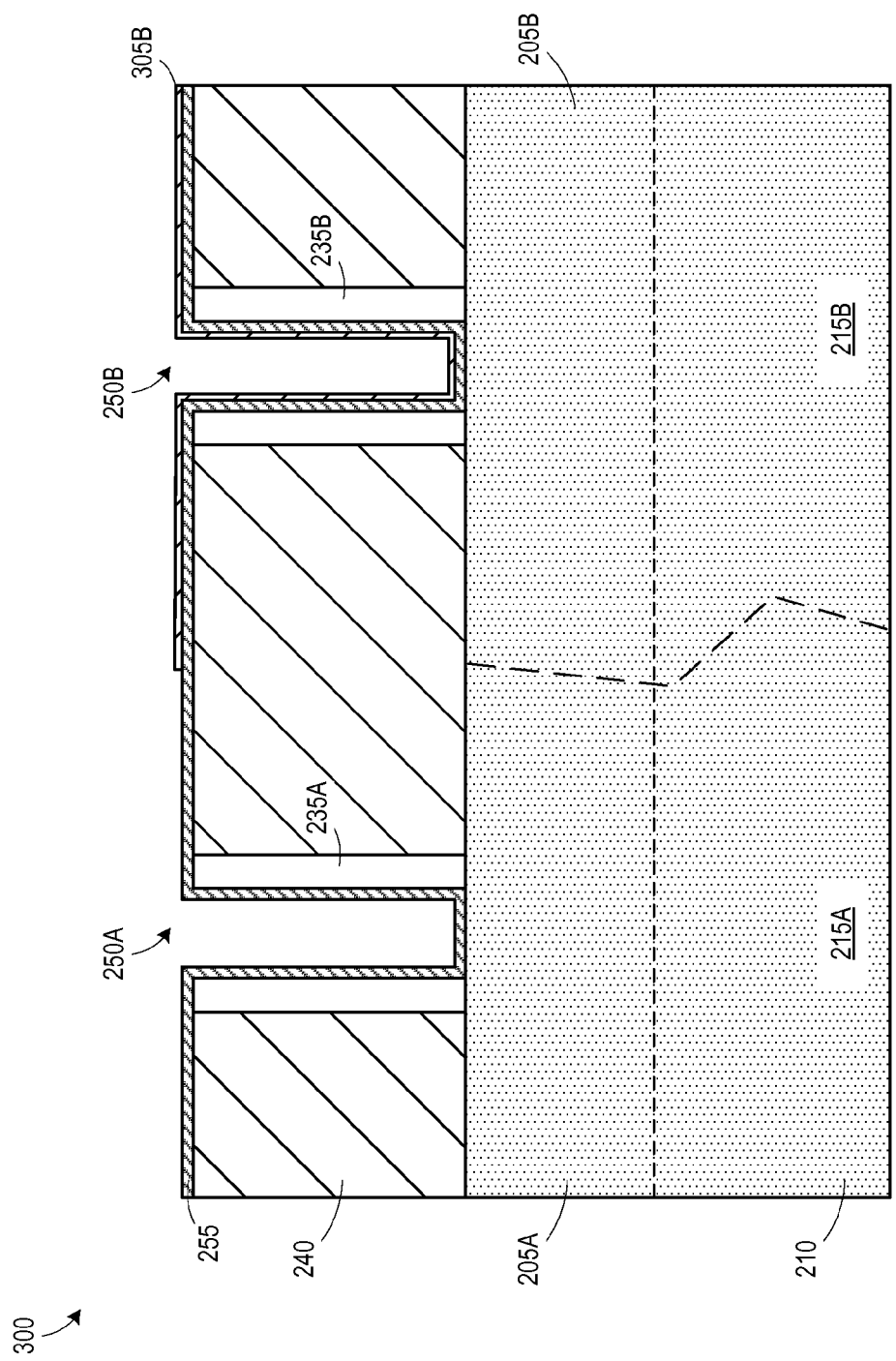

FIG. 3B illustrates the product 300 after performing a masked etch process (similar to FIG. 2G) to remove the barrier layer 305 from the gate cavity 250A, while leaving a remaining portion of the barrier layer 305B in the gate cavity 250B.

Figure 3C:
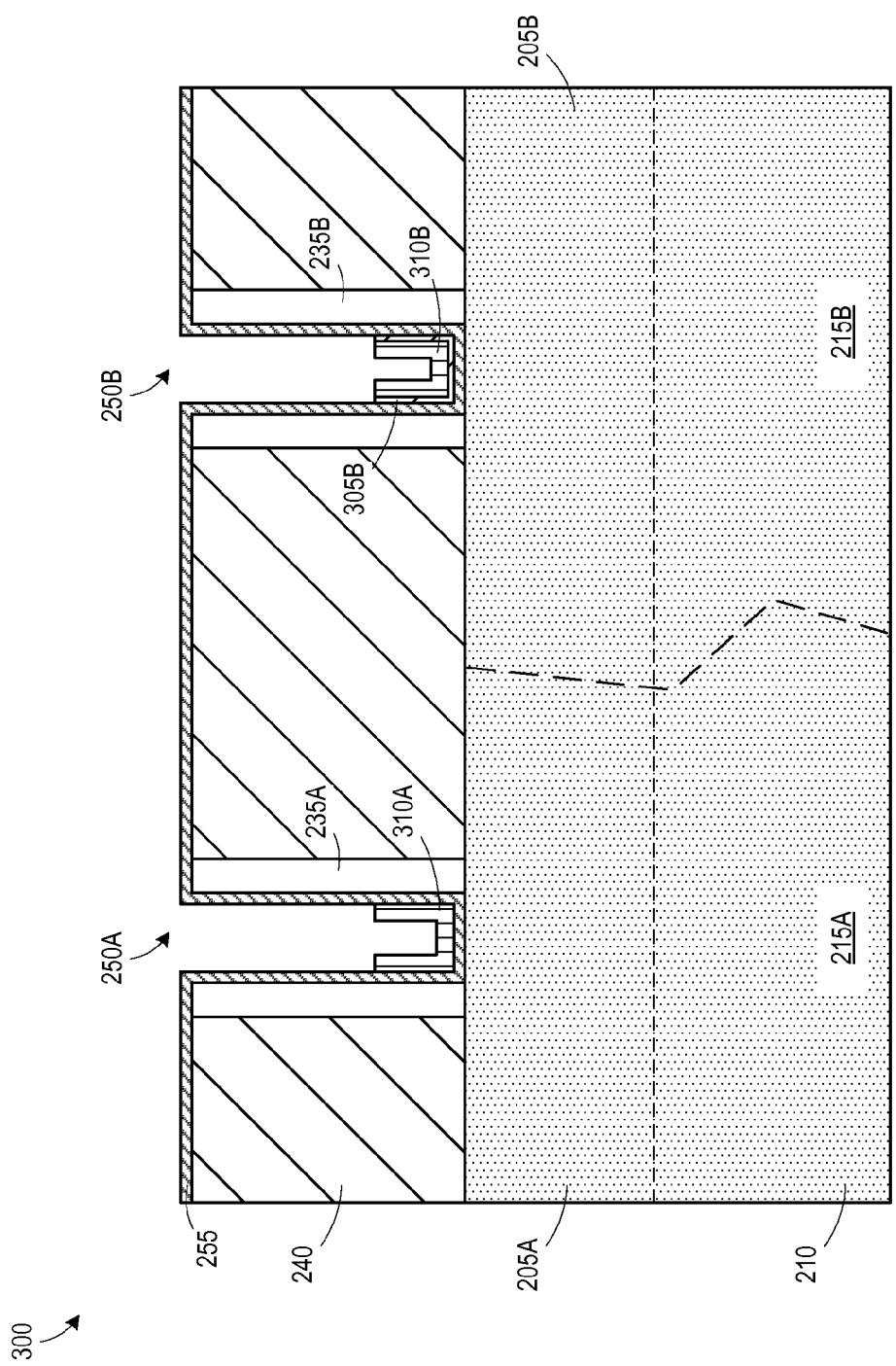

FIG. 3C illustrates the product 300 after a plurality of processes were performed to form recessed work function material layers 310A, 310B in the gate recesses 250A, 250B, respectively, using the process described above in reference to FIG. 2E. The recessing of the work function material also recesses the barrier layer 305B. In the illustrated embodiment, the work function material layers 310A, 310B are each comprised of a stack of layers including TiN/TiC/TiN.

Figure 3D:
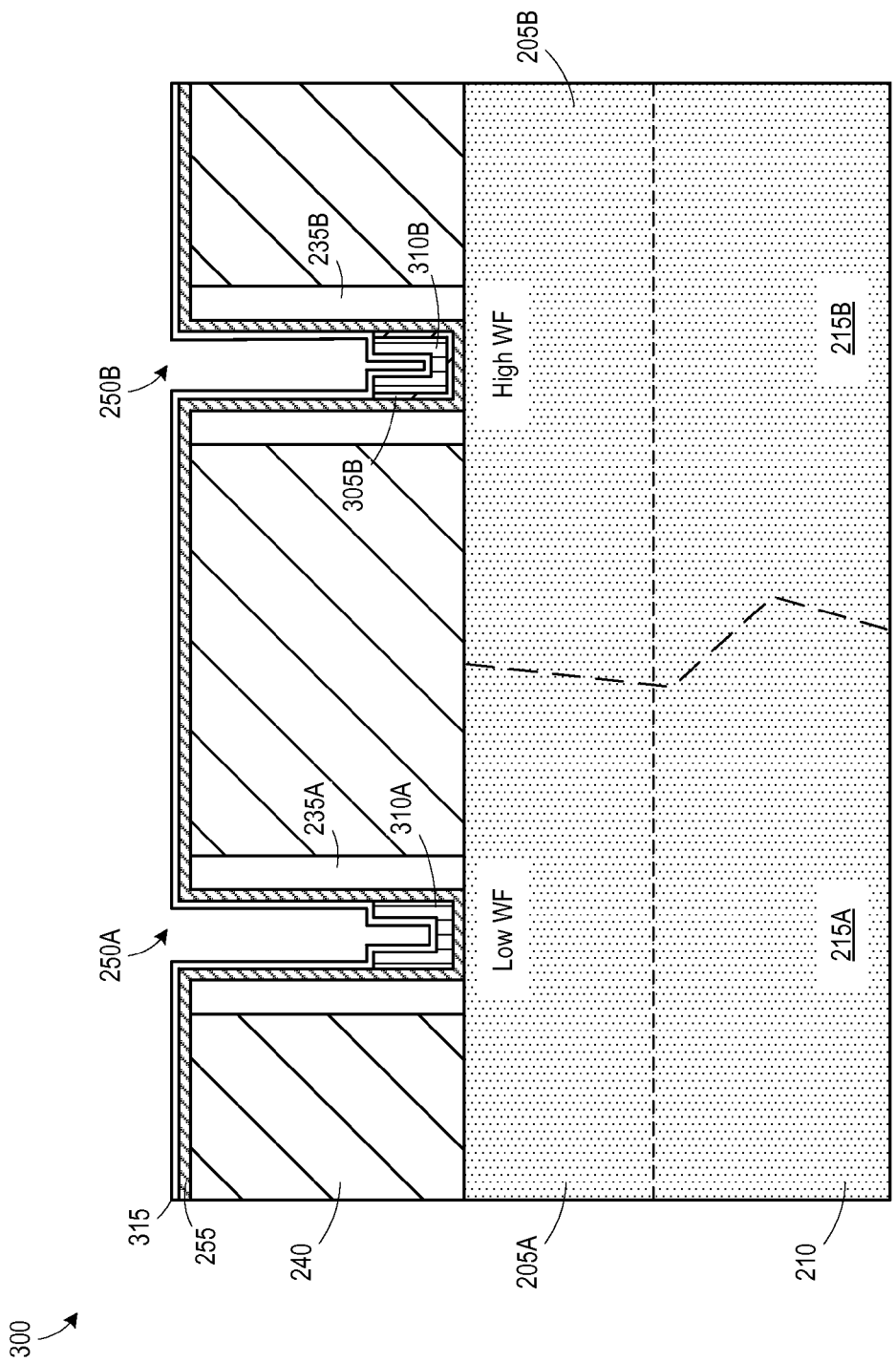

FIG. 3D illustrates the product 300 after a conformal deposition process was performed to form a second barrier layer 315 (e.g., TiN) in the gate cavities 250A, 250B. Because the gate cavity 250B has a thicker bottom barrier layer from the presence of the two barrier layers 305B, 315 its net work function is higher than the gate cavity 250A.

Figure 3E:
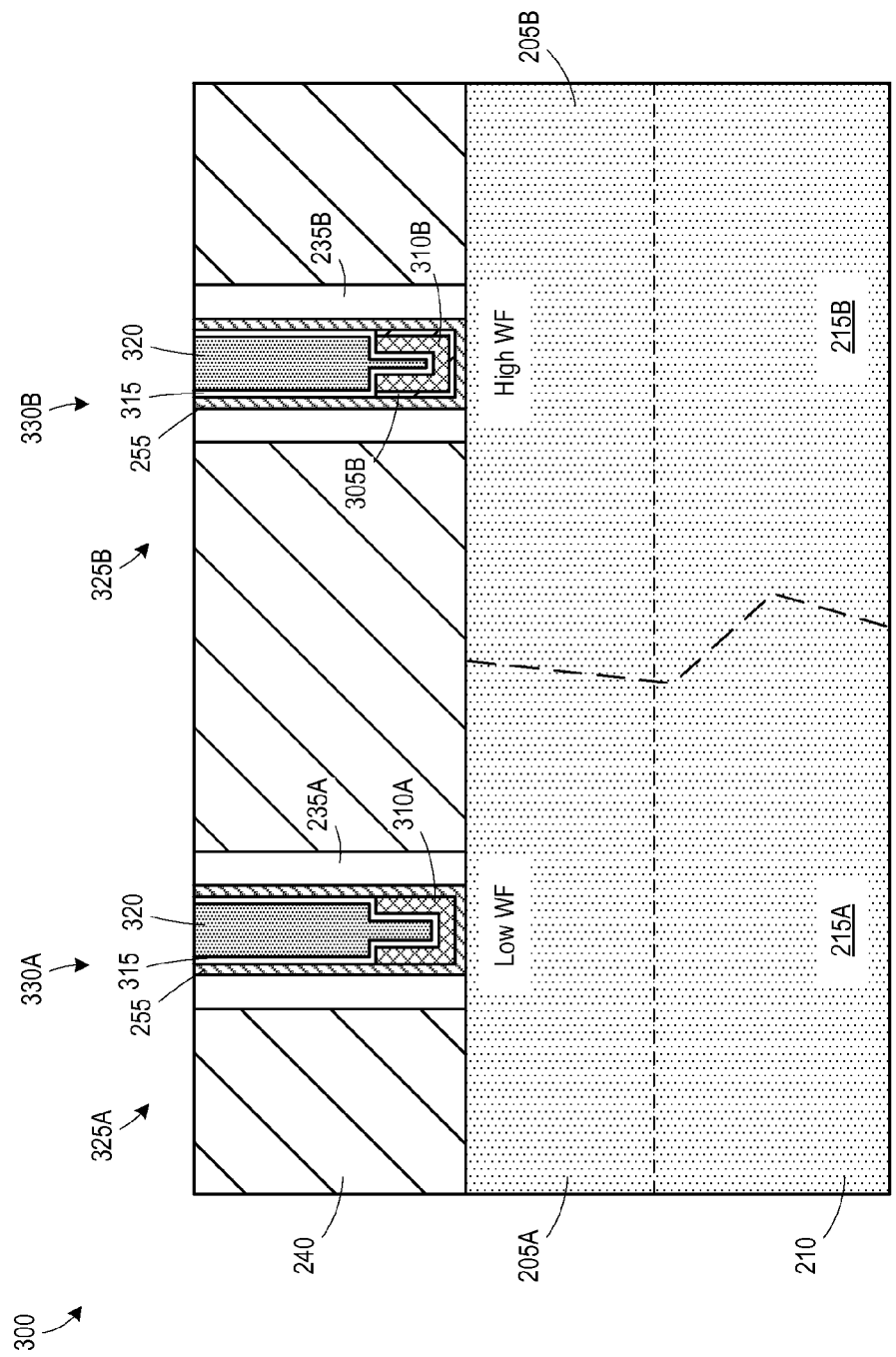

FIG. 3E illustrates the product 300 after a deposition process was performed to fill the gate cavities 250A, 250B with a conductive gate electrode material 320 (e.g., tungsten) and a planarization process was performed to remove excess portions of the conductive gate electrode material 320 and compete replacement gate electrode structures 325A, 325B. During the deposition process, a treatment species, such as fluorine, oxygen or nitrogen, is provided in the precursor gases used in forming the conductive gate electrode material 320. For example, the precursor gas for the deposition process may be $WF_6$. The treatment precursor permeates the barrier layer 315 in the gate cavities 250A, 250B and increases the work function of both work function material layers 310A, 310B approximately equally.

Other steps, not detailed herein, may be performed to complete the transistor devices 330A, 330B, such as doping the source/drain regions not covered by the gate structures, forming epitaxial material on the fins, forming silicide layers, forming contacts, etc.

The threshold voltages associated with each of the transistor devices 330A, 330B depends on the conductivity type and the treatments received. Table 2 below illustrates the threshold voltages depending on the work function and conductivity type. The threshold voltages are classified as a regular threshold voltage (RVT) or a super low threshold voltage (SLVT).

TABLE 2

Threshold Voltage Characteristics

| $V_t$ | SLVT | RVT |
|---|---|---|
| nFET | Low WF (330A) | High WF (330B) |
| pFET | High WF (330B) | Low WF (330A) |

Using the techniques described in FIGS. 3A-3E, transistor devices having different threshold voltages may be formed using the same processes for forming and doping the gate insulation layer 255, forming the work function material layers 310A, 310B, forming the final barrier layer 315, and forming the gate electrode material 320 in the presence of a treatment precursor. Threshold voltage changes may be modulated based on the absence or presence of the barrier layer 305B below the work function material layers 310A, 310B, respectively. Due to the large degree of integration provided, the processing is more cost effective and there is less process variation.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is therefore evident that the particular embodiments disclosed above may be altered or modified and all such variations are considered within the scope and spirit of the invention. Note that the use of terms, such as "first," "second," "third" or "fourth" to describe various processes or structures in this specification and in the attached claims is only used as a shorthand reference to such steps/structures and does not necessarily imply that such steps/structures are performed/formed in that ordered sequence. Of course, depending upon the exact claim language, an ordered sequence of such processes may or may not be required. Accordingly, the protection sought herein is as set forth in the claims below.

What is claimed:

1. A method, comprising:
  forming first and second gate cavities so as to expose first and second portions, respectively, of a semiconductor material;
  forming a gate insulation layer in said first and second gate cavities;
  selectively forming a first barrier layer only in said second gate cavity;
  forming a first work function material layer in said first gate cavity above said gate insulation layer and a second work function material layer in said second gate cavity above said first barrier layer;
  forming a second barrier layer above said first work function material layer and said gate insulation layer in said first gate cavity and above said second work function material layer, said first barrier layer and said gate insulation layer in said second gate cavity; and
  forming a conductive material above said second barrier layer in said first and second gate cavities in the presence of a treatment species to define first and second gate electrode structures, respectively.

2. The method of claim 1, wherein said first work function material layer and said second work function material layer have approximately the same concentration of said treatment species.

3. The method of claim 2, wherein said treatment species comprises one of fluorine, oxygen or nitrogen.

4. The method of claim 1, wherein said first gate electrode structure has a first work function lower than a second work function of said second gate electrode structure.

5. The method of claim 1, wherein forming said gate insulation layer comprises forming a doped high-k gate insulation layer.

6. The method of claim 5, wherein said doped high-k gate insulation layer comprises hafnium oxide doped with at least one of yttrium or lanthanum.

7. The method of claim 1, wherein said first and second work function material layers each comprises a stack of titanium nitride, titanium carbide and titanium nitride.

8. The method of claim 6, wherein said first barrier layer comprises titanium nitride.

9. The method of claim 6, wherein said second barrier layer comprises titanium nitride and said conductive material comprises tungsten.

10. A method, comprising:
forming a first gate electrode structure in a first cavity, said first gate electrode structure including a first gate insulation layer, a first barrier layer formed above a first portion of said first gate insulation layer, a first work function material layer formed above said first barrier layer, and a second barrier layer formed above said first work function material layer and a second portion of said first gate insulation layer;
forming a second gate electrode structure in a second cavity, said second gate electrode structure including a second gate insulation layer, a second work function material layer formed above a first portion of said second gate insulation layer, and said second barrier layer formed above said second work function material layer and a second portion of said second gate insulation layer; and
forming a conductive material above said second barrier layer in said first and second cavities in the presence of a treatment species to define first and second gate electrode structures, respectively.

11. The method of claim 10, wherein said first work function material layer and said second work function material layer have approximately the same concentration of said treatment species.

12. The method of claim 10, wherein said treatment species comprises one of fluorine, oxygen or nitrogen.

13. The method of claim 10, wherein said first gate electrode structure has a first work function higher than a second work function of said second gate electrode structure.

14. The method of claim 10, wherein forming said gate insulation layer comprises forming a doped high-k gate insulation layer.

15. The method of claim 14, wherein said doped high-k gate insulation layer comprises hafnium oxide doped with at least one of yttrium or lanthanum.

* * * * *